(12) United States Patent
Tsai et al.

(10) Patent No.: US 12,419,075 B2
(45) Date of Patent: Sep. 16, 2025

(54) TRANSISTOR WITH EMBEDDED INSULATING STRUCTURE SET

(71) Applicant: UNITED MICROELECTRONICS CORP., Hsin-Chu (TW)

(72) Inventors: Ming-Hua Tsai, Tainan (TW); Chin-Chia Kuo, Tainan (TW); Wei-Hsuan Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 344 days.

(21) Appl. No.: 18/120,980

(22) Filed: Mar. 13, 2023

(65) Prior Publication Data
US 2024/0266435 A1    Aug. 8, 2024

(30) Foreign Application Priority Data
Feb. 6, 2023    (TW) .................................. 112104035

(51) Int. Cl.
*H10D 30/60*    (2025.01)
*H10D 30/01*    (2025.01)
*H10D 62/10*    (2025.01)

(52) U.S. Cl.
CPC ....... *H10D 30/603* (2025.01); *H10D 30/0227* (2025.01)

(58) Field of Classification Search
CPC ............. H10D 30/0227; H10D 30/603; H10D 62/116; H10D 30/605
See application file for complete search history.

(56) References Cited

U.S. PATENT DOCUMENTS

| | | | |
|---|---|---|---|
| 7,217,985 B2 * | 5/2007 | Kim | ........................ H10D 84/83 257/500 |
| 8,643,101 B2 | 2/2014 | Kao | |
| 8,836,067 B2 | 9/2014 | Hsu | |
| 11,171,222 B2 | 11/2021 | Kim | |
| 2020/0251575 A1 * | 8/2020 | Kim | ................... H10D 30/0227 |
| 2022/0069081 A1 * | 3/2022 | Lin | ..................... H10D 30/0281 |
| 2022/0336502 A1 | 10/2022 | Oh | |

FOREIGN PATENT DOCUMENTS

| | | |
|---|---|---|
| JP | 2005-150331 A | 6/2005 |
| JP | 2010-62182 A | 3/2010 |

* cited by examiner

*Primary Examiner* — Joshua Benitez Rosario
*Assistant Examiner* — Jacob T Nelson
(74) *Attorney, Agent, or Firm* — Winston Hsu (57) ABSTRACT

A transistor with an embedded insulating structure set includes a substrate. A gate is disposed on the substrate. A first lightly doped region is disposed at one side of the gate. A second lightly doped region is disposed at another side of the gate. The first lightly doped region and the second lightly doped region have the same conductive type. The first lightly doped region is symmetrical to the second lightly doped region. A first source/drain doped region is disposed within the first lightly doped region. A second source/drain doped region is disposed within the second lightly doped region. A first insulating structure set is disposed within the first lightly doped region and the first source/drain doped region. The first insulating structure set includes an insulating block embedded within the substrate. A sidewall of the insulating block contacts the gate dielectric layer.

19 Claims, 5 Drawing Sheets

TRANSISTOR WITH EMBEDDED INSULATING STRUCTURE SET

BACKGROUND OF THE INVENTION

1. Field of the Invention

The present invention relates to a metal oxide semiconductor (MOS) transistor, and more particularly to an MOS transistor which uses an embedded insulating structure set to increase breakdown voltage and decrease current leakage.

2. Description of the Prior Art

Currently, the application of high voltage MOS transistor is increasing, and it can be applied to personal computers, servers, power supply, communication electronics, cell phones, consumer products and industrial application products. Power transistor plays an important role in power switches. Power transistors of different withstand voltage levels are used in different products.

When the pitch between transistors is shrinking, the breakdown voltage decreases as the space between the gate and the drain getting smaller. However, conventionally, in order for the transistor to sustain higher breakdown voltage, the space between the gate and the drain needs to be extended. The extended space leads to the increase of the transistor's area. Therefore, a transistor structure which can sustain high voltage and without increasing transistor's area is needed.

SUMMARY OF THE INVENTION

In view of this, the prevent invention provide a transistor with an embedded insulating structure set to achieve higher breakdown voltage and lower current leakage.

According to a preferred embodiment of the present invention, a transistor with an embedded insulating structure set includes a substrate with an active region thereon. A gate is disposed within the active region. A gate dielectric layer is disposed between the gate and the active region. A first lightly doped region is disposed within the active region at one side of the gate. A second lightly doped region is disposed within the active region at another side of the gate, wherein the first lightly doped region and the second lightly doped region have the same conductive type, and wherein by taking a symmetrical line of the gate as a given axis, the first lightly doped region is symmetrical to the second lightly doped region. A first source/drain doped region is disposed within the first lightly doped region. A second source/drain doped region is disposed within the second lightly doped region. A first insulating structure set disposed is within the first lightly doped region and the first source/drain doped region, wherein the first insulating structure set includes a first insulating block embedded within the substrate and a sidewall of the first insulating block contacts the gate dielectric layer These and other objectives of the present invention will no doubt become obvious to those of ordinary skill in the art after reading the following detailed description of the preferred embodiment that is illustrated in the various figures and drawings.

DETAILED DESCRIPTION

Figure 1:
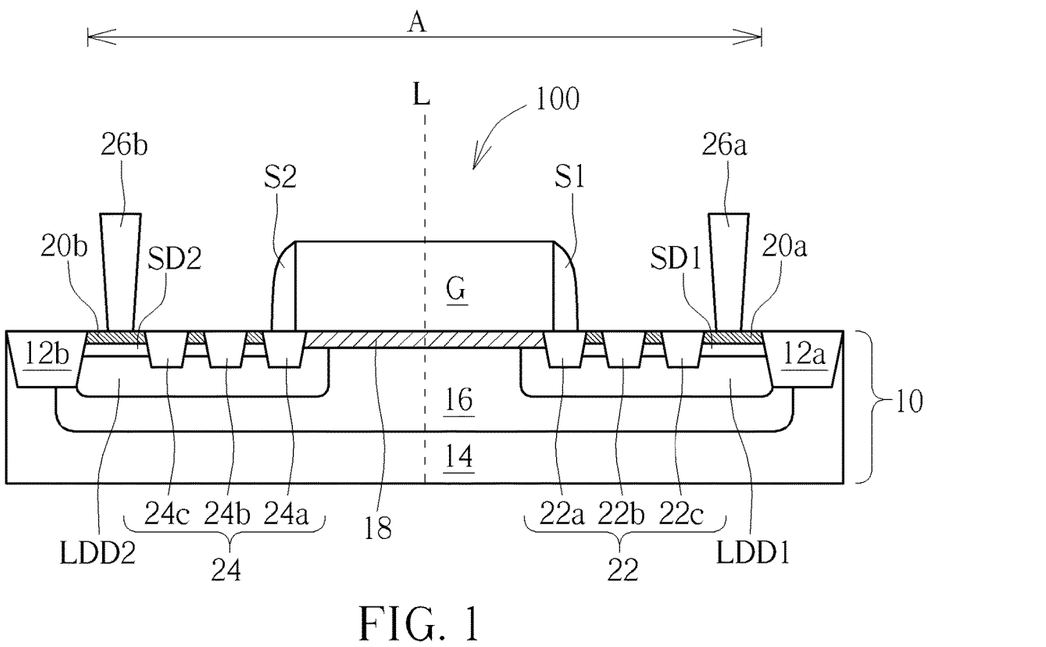
FIG. 1 depicts a transistor with an embedded insulating structure set according to a first preferred embodiment of the present invention.

FIG. 1 depicts a transistor with an embedded insulating structure set according to a first preferred embodiment of the present invention.

As shown in FIG. 1, a transistor 100 with an embedded insulating structure set includes a substrate 10. A first shallow trench isolation 12a and a second shallow trench isolation 12b are embedded within the substrate 10. The first shallow trench isolation 12a and the second shallow trench 12b define the active region A on the substrate 10. A deep well 14 is disposed within the active region A. A well 16 is disposed within the deep well region 14. A gate G is disposed within the active region A. Two spacers S1/S2 are respectively disposed at two sides of the gate G. A gate dielectric layer 18 is disposed between the gate G and the active region A and the gate dielectric layer 18 is embedded within the substrate 10. A first lightly doped region LDD1 is disposed within the active region A at one side of the gate G. A second lightly doped region LDD2 is disposed within the active region A at another side of the gate G. The first lightly doped region LDD1 and the second lightly doped region LDD2 have the same conductive type. Moreover, by taking a symmetrical line L of the gate G as a given axis, the first lightly doped region LDD1 is symmetrical to the second lightly doped region LDD2. A first source/drain doped region SD1 is disposed within the first lightly doped region LDD1. A second source/drain doped region SD2 is disposed within the second lightly doped region LDD2. Silicide layers 20a/20b are respectively disposed on the first source/drain doped region SD1 and the second source/drain doped region SD2. The deep well 14, the first lightly doped region LDD1, the second lightly doped region LDD2, the first source/drain doped region SD1 and the second source/drain doped region SD2 have a first conductive type. The well 16 has a second conductive type. In this embodiment, the first conductive type is N type. The second conductive type is P type. However, in a different embodiment, the first conductive type can be P type. The second conductive type can be N type.

The first insulating structure set 22 is disposed within the first lightly doped region LDD and the first source/drain doped region SD1. The first insulating structure set 22 includes at least an insulating block 22a embedded within the substrate 10. A sidewall of the insulating block 22a contacts an end of the gate dielectric layer 18. Part of the insulating block 22a overlaps the gate G and another part of the insulating block 22a overlaps the spacer S1 which is closer to the first source/drain doped region SD1. The number of the insulating block in the first insulating structure set 22 can be adjusted based on different requirement. The number of the insulating block can be 1 or more than 1. In the first preferred embodiment, there are three insulating blocks 22a/22b/22c presented as an example. Among three insulating blocks 22a/22b/22c, the insulating block 22a is the closest to the gate G and the insulating block 22c is the farthest from the gate G. The size and the shape of the three insulating blocks 22a/22b/22c are the same. Moreover, the depth of each of the three insulating blocks 22a/22b/22c is larger than the depth of the first source/drain doped region SD1.

Furthermore, with respective to the gate G, the first shallow trench isolation 12a is disposed at the same side of the first source/drain doped region SD1. The first source/drain doped region SD1 is between the insulating blocks 22a/22b/22c, and between the first insulating structure set 22 and the first shallow trench isolation 12a. The first source/drain doped region SD1 contacts the insulating blocks 22a/22b/22c and the first shallow trench isolation 12a. A conductive plug 26a contacts the silicide layer 20a on the first source/drain doped region SD1 which is between the first insulating structure set 22 and the first shallow trench isolation 12a.

In addition, the transistor 100 with an embedded insulating structure set further includes a second insulating structure set 24 disposed within the second lightly doped region LDD2 and the second source/drain doped region SD2. By taking the symmetrical line L of the gate G as the given axis, the transistor 100 with an embedded insulating structure set is in left-right symmetry. Therefore, the location of the insulating blocks of the second insulating structure set 24 are entirely the same as the location of the insulating blocks of the first insulating structure set 22. For example, the second insulating structure set 24 includes insulating blocks 24a/24b/24c. Furthermore, a silicide layer 20b is disposed on the second source/drain doped region SD2. A conductive plug 26b contacts the silicide layer 20b.

The advantage of making the transistor 100 with an embedded insulating structure set in left-right symmetry is that the first source/drain doped region SD1 and the second source/drain doped region SD2 can be source or drain selectively based on requirements. Besides, the conventional MOS transistors are also in left-right symmetry, therefore, the fabricating steps of the transistor 100 with an embedded insulating structure set in left-right symmetry can be compatible with the fabricating steps of the conventional MOS transistor.

The fabricating steps of the transistor 100 with an embedded insulating structure set includes forming the first shallow trench isolation 12a, the second trench isolation 12b, the first insulating structure set 22 and the second insulating structure set 24. If the depths of the first shallow trench isolation 12a, the second trench isolation 12b, the first insulating structure set 22 and the second insulating structure set 24 are the same, they can be formed by forming numerous trenches simultaneously within the substrate 10 to contain the first shallow trench isolation 12a, the second trench isolation 12b, the first insulating structure set 22 and the second insulating structure set 24. If the depths of the first shallow trench isolation 12a, the second trench isolation 12b, the first insulating structure set 22 and the second insulating structure set 24 are different, numerous trenches with different depths have to be manufactured in different steps. Then, isolating material is filled in the trenches with different depths to form the first shallow trench isolation 12a, the second trench isolation 12b, the first insulating structure set 22 and the second insulating structure set 24. After the first shallow trench isolation 12a, the second trench isolation 12b, the first insulating structure set 22 and the second insulating structure set 24 are completed, dopants are implanted into the substrate 10 to form the deep well 14. Thereafter, other dopants are implants into the substrate 10 to form the well 16. Later, a photoresist (not shown) is formed to cover a predetermined position for the gate G. Next, by taking the photoresist as a mask, dopants are implanted to form the first lightly doped region LDD1 and the second lightly doped region LDD2 simultaneously. Subsequently, the photoresist is removed. Then, the gate dielectric layer 18, the gate G and the spacers S1/S2 are formed in sequence. Finally, the first source/drain doped region SD1 and the second source/drain doped region SD2 are formed by taking the spacers S1/S2 and the gate G as a mask, In the transistor 100 with embedded insulating structure set, the withstand voltage between the gate G and the first source/drain doped region SD1 and the withstand voltage between the gate G and the second source/drain doped region SD2 can be adjusted by altering the device structures. When the withstand voltage is adjusted, the current leakage between the gate G and the first source/drain doped region SD1 or between the gate G and the second source/drain doped region SD2 can be reduced.

The above-mentioned device structures includes the numbers of the insulating block of the first insulating structure set 22, the shape of the insulating block of the first insulating structure set 22, the relative depth of the insulating block of the first insulating structure set 22 with respective to the depth of the first source/drain doped region SD1, the position of the insulating block of the first insulating structure set 22, the range of the first source/drain doped region SD1, the position of the gate dielectric layer 18 and whether or not the first insulating structure set 22 is symmetrical to the second insulating structure set 24. By arranging aforesaid the device structures differently, many transistors with different withstand voltage can be accomplished. Each of transistors with different withstand voltage share the same features as follows. First, the first lightly doped region LDD1 and the second lightly doped region LDD2 have the same conductive type. Secondly, by taking the symmetrical line L of the gate G as the given axis, the first lightly doped region LDD1 is symmetrical to the second lightly doped region LDD2. Thirdly, among all insulating blocks, the insulating block which is the closest to the gate G, such as the insulating block 22a, has a sidewall which contacts the gate dielectric layer 18.

In the following description, several embodiments will be used to illustrate the way of altering device structures. However, the present invention does not limited to the following embodiments.

Figure 2:
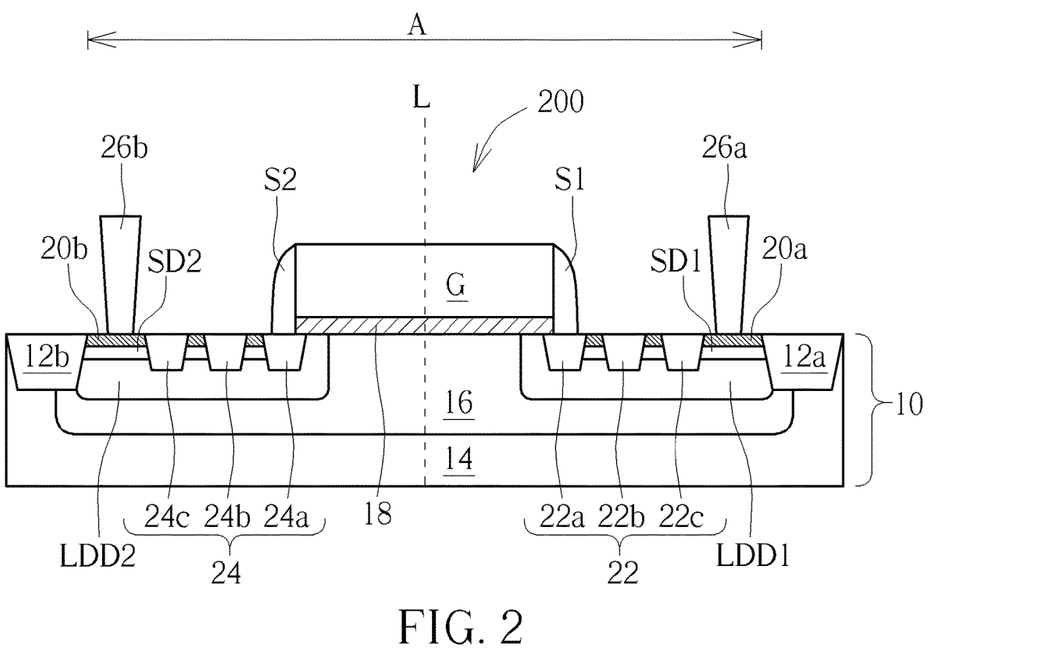
FIG. 2 depicts a transistor with an embedded insulating structure set according to a second preferred embodiment of the present invention.

FIG. 2 depicts a transistor with an embedded insulating structure set according to a second preferred embodiment of the present invention, wherein elements which are substantially the same as those in the first preferred embodiment are denoted by the same reference numerals; an accompanying explanation is therefore omitted.

As shown in FIG. 2, the gate dielectric layer 18 of a transistor 200 with an embedded insulating structure set is disposed on a top surface of the substrate 10. That is, the gate dielectric layer 18 does not embed within the substrate 10. Therefore, the insulating block 22a contacts the bottom of the gate dielectric layer 18, but does not contact the end of the gate dielectric layer 18. Other elements are the same as those of the first preferred embodiment.

Figure 3:
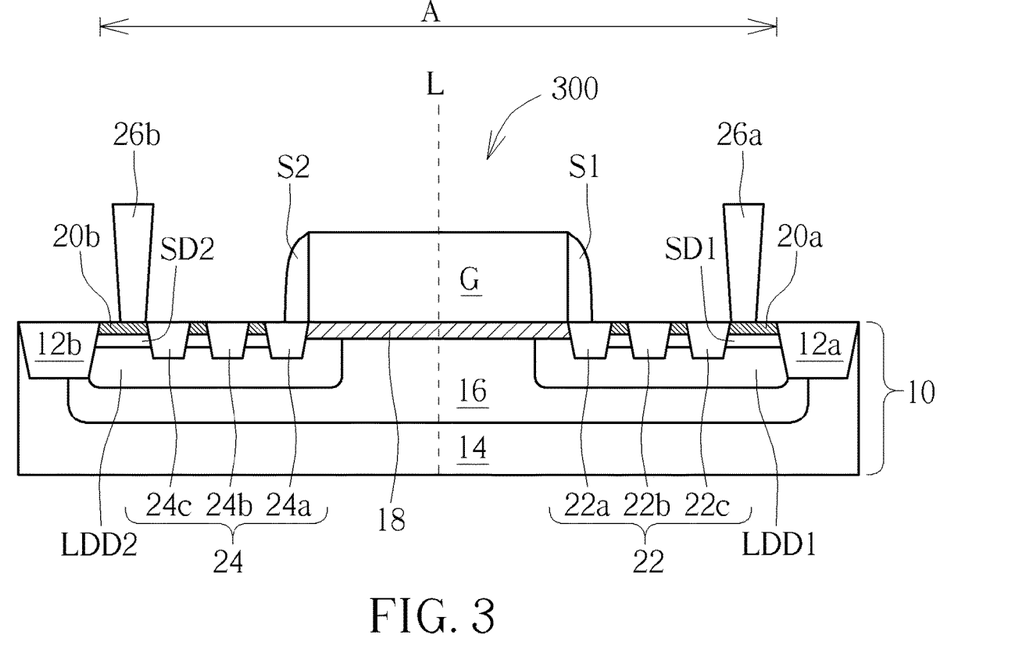
FIG. 3 depicts a transistor with an embedded insulating structure set according to a third preferred embodiment of the present invention.

FIG. 3 depicts a transistor with an embedded insulating structure set according to a third preferred embodiment of the present invention, wherein elements which are substantially the same as those in the first preferred embodiment are denoted by the same reference numerals; an accompanying explanation is therefore omitted.

As shown in FIG. 3, the insulating block 22a of the transistor 300 with an embedded insulating structure set does not overlaps the gate G, and only overlaps the spacer S1. In this way, the transistor 300 with an embedded insulating structure set has longer channel than the transistor 100 with an embedded insulating structure set. Other elements are the same as those of the first preferred embodiment.

Figure 4:
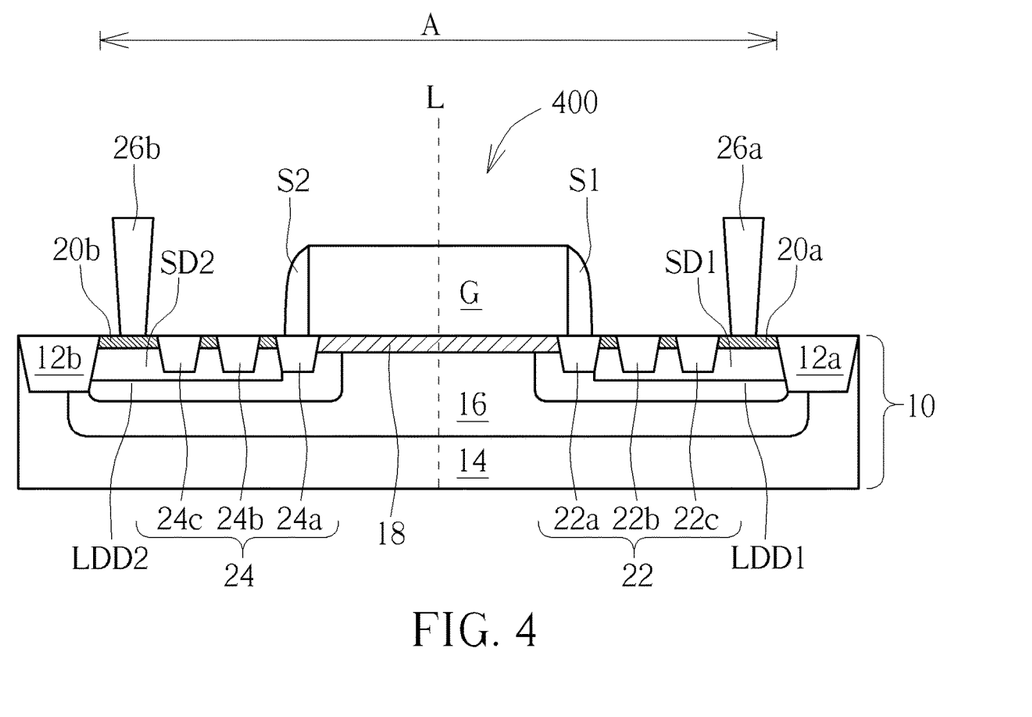
FIG. 4 depicts a transistor with an embedded insulating structure set according to a fourth preferred embodiment of the present invention.

FIG. 4 depicts a transistor with an embedded insulating structure set according to a fourth preferred embodiment of the present invention, wherein elements which are substantially the same as those in the first preferred embodiment are denoted by the same reference numerals; an accompanying explanation is therefore omitted.

As shown in FIG. 4, the depths of the insulating blocks 22a/22b/22c of the transistor 400 with an embedded insulating structure set are smaller than the depth of the first source/drain doped region SD1. In this embodiment, the insulating blocks 22b/22c are entirely encompassed within the first source/drain doped region SD1. Other elements are the same as those of the first preferred embodiment.

Figure 5:
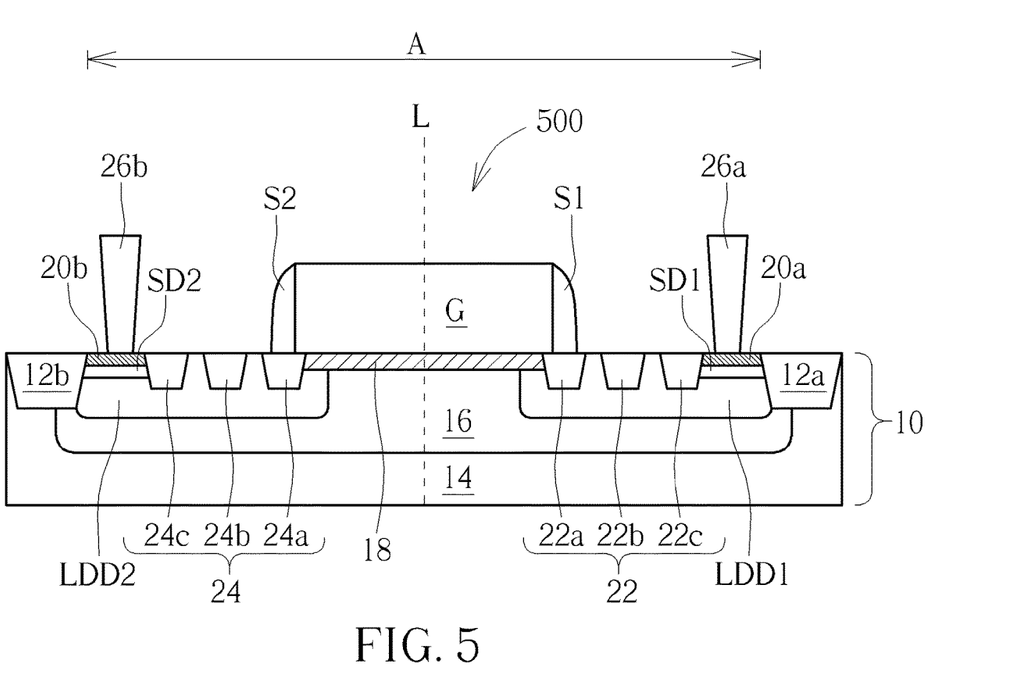
FIG. 5 depicts a transistor with an embedded insulating structure set according to a fifth preferred embodiment of the present invention.

FIG. 5 depicts a transistor with an embedded insulating structure set according to a fifth preferred embodiment of the present invention, wherein elements which are substantially the same as those in the first preferred embodiment are denoted by the same reference numerals; an accompanying explanation is therefore omitted.

As shown in FIG. 5, the first source/drain doped region SD1 of the transistor 500 with an embedded insulating structure set is disposed outside of the first insulating structure set 22 and only between the first insulating structure set 22 and the first shallow trench isolation 12a. There is no first source/drain doped region SD1 within the first insulating structure set 22. Other elements are the same as those of the first preferred embodiment.

Figure 6:
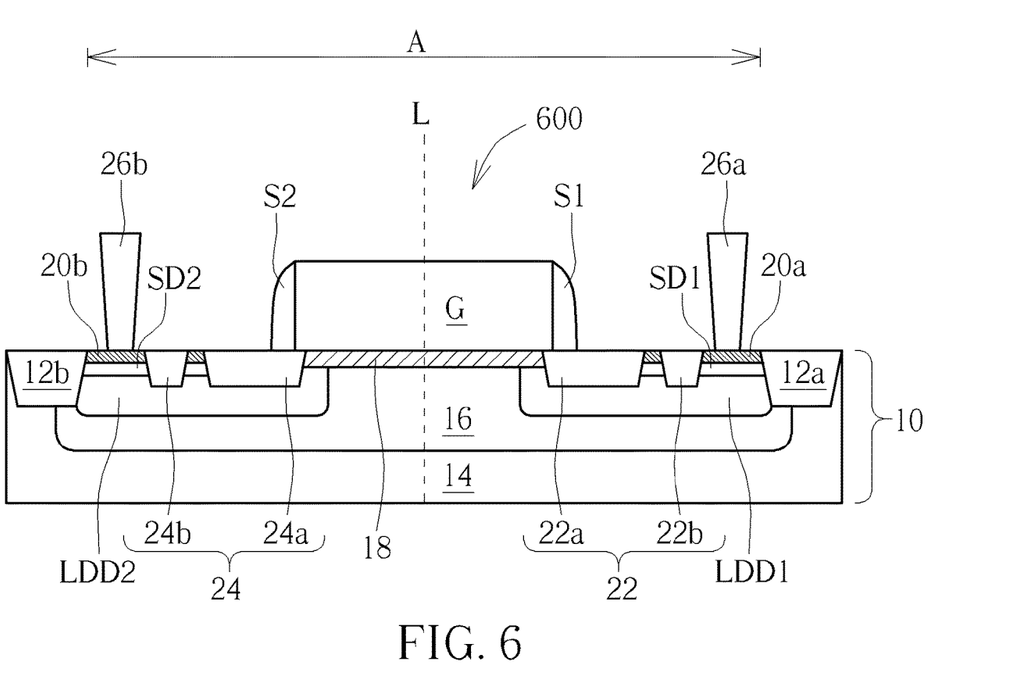
FIG. 6 depicts a transistor with an embedded insulating structure set according to a sixth preferred embodiment of the present invention.

FIG. 6 depicts a transistor with an embedded insulating structure set according to a sixth preferred embodiment of the present invention, wherein elements which are substantially the same as those in the first preferred embodiment are denoted by the same reference numerals; an accompanying explanation is therefore omitted.

As shown in FIG. 6, in the transistor 600 with an embedded insulating structure set, the widths of the insulating blocks 22a/22b of the first insulating structure set 22 are different from each other. For example, the width of the insulating block 22a is larger than the width of the insulating block 22b. Furthermore, comparing to the first preferred embodiment, there is only two insulating blocks 22a/22b in the first insulating structure set 22. The number of the insulating block in the first insulating structure set 22 of the transistor 600 with an embedded insulating structure set is less than number of the insulating block in the first insulating structure set 22 of the transistor 100 with an embedded insulating structure set. Other elements are the same as those of the first preferred embodiment. In addition, the insulating block which has a larger width is disposed closer to the gate dielectric layer 18, and the insulating block which has a smaller width is disposed farther to the gate dielectric layer 18. The insulating block which has the larger width can separate the first source/drain doped region SD1 from the gate dielectric layer 18 with greater distance. Therefore, current leakage between the first source/drain doped region SD1 and the gate G can be reduced more efficiently. However, if the width of the insulating block 22b is widen as well, the size of the transistor will be further increased. Therefore, the present invention specially designs that the insulating block which has a larger width is disposed closer to the gate dielectric layer 18, and the insulating block which has a smaller width is disposed farther to the gate dielectric layer 18 to take care of both the size of the transistor and the current leakage.

Figure 7:
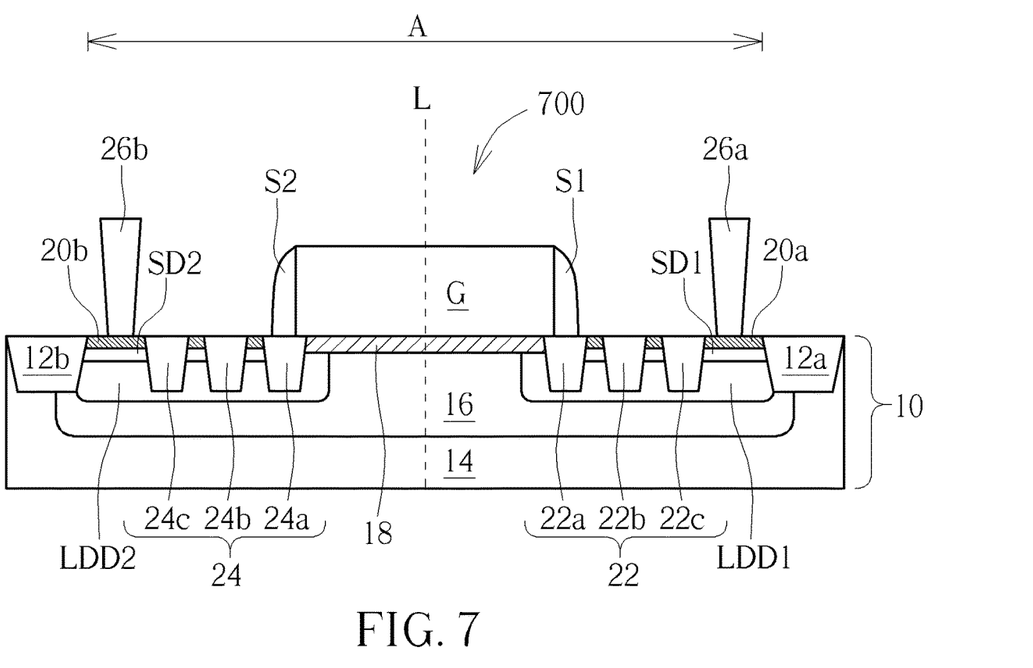
FIG. 7 depicts a transistor with an embedded insulating structure set according to a seventh preferred embodiment of the present invention.

FIG. 7 depicts a transistor with an embedded insulating structure set according to a seventh preferred embodiment of the present invention, wherein elements which are substantially the same as those in the first preferred embodiment are denoted by the same reference numerals; an accompanying explanation is therefore omitted.

As shown in FIG. 7, the depths of the insulating block 22a/22b/22c of the transistor 700 with an embedded insulating structure set are the same as that of the first shallow trench isolation 12a. Other elements are the same as those of the first preferred embodiment.

Figure 8:
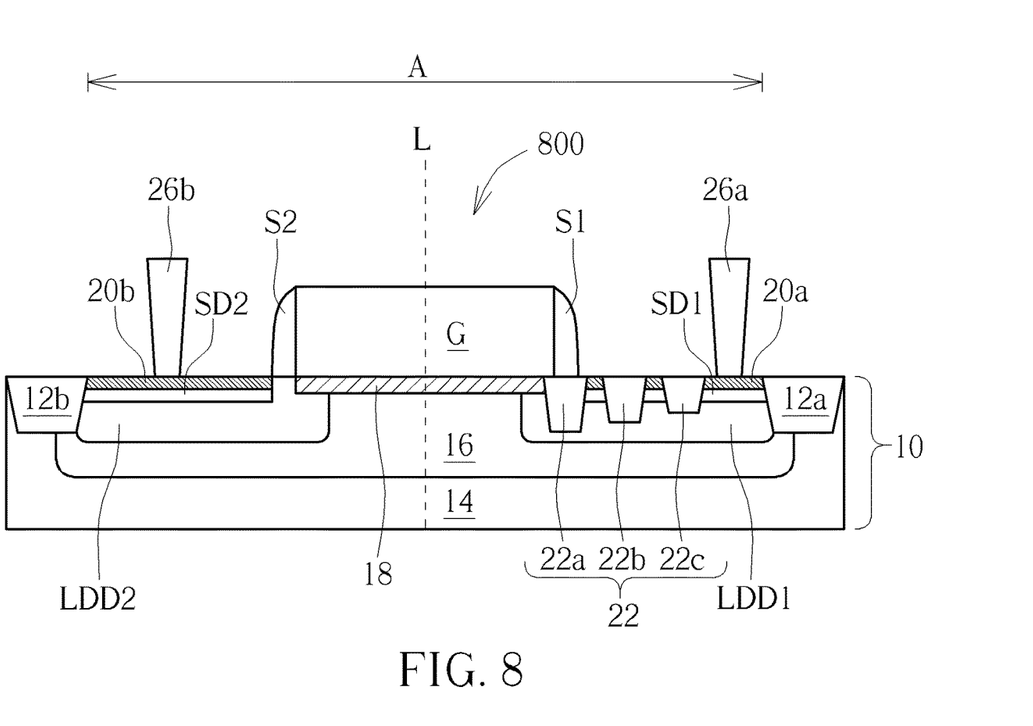
FIG. 8 depicts a transistor with an embedded insulating structure set according to an eighth preferred embodiment of the present invention.

FIG. 8 depicts a transistor with an embedded insulating structure set according to an eighth preferred embodiment of the present invention, wherein elements which are substantially the same as those in the first preferred embodiment are denoted by the same reference numerals; an accompanying explanation is therefore omitted.

As shown in FIG. 8, the transistor 800 with an embedded insulating structure set only has the first insulating structure set 22, but there is no second insulating structure set within the second source/drain doped region SD2. That is, the transistor 800 with an embedded insulating structure set is an asymmetrical structure. This asymmetrical structure is because the device structure of the first source/drain doped region SD1 and the second source/drain doped region SD2 are adjusted according to different withstand voltage required by the drain doped region and the source doped region. Moreover, because there is no second insulating structure set, the conductive plug 26b on the second source/drain doped region SD2 can be located freely in horizontal direction, and does not limited by the position of the insulating block. Furthermore, the depth of the insulating block 22a is largest, the depth of the insulating block 22c is smallest, and the depth of the insulating block 22b is between the depth of the insulating block 22a and the depth of the insulating block 22c. That is, the insulating block with larger depth is closer to the gate dielectric layer 18, and the insulating block with smaller depth is farther from the gate dielectric layer 18. This structure has the advantage that current has to flow more depth when passing the insulating block 22a. In this way, the current leakage occurred at the bottom of the gate can be lower. However, if the depths of the insulating block 22b/22c are the same as that of the insulating block 22a, the on-resistance will be increased greatly. In order to take care of both the on-resistance of the transistor and the current leakage, the insulating block with larger depth is disposed closer to the gate dielectric layer 18, and the insulating block with smaller depth is disposed farther from the gate dielectric layer 18.

Figure 9:
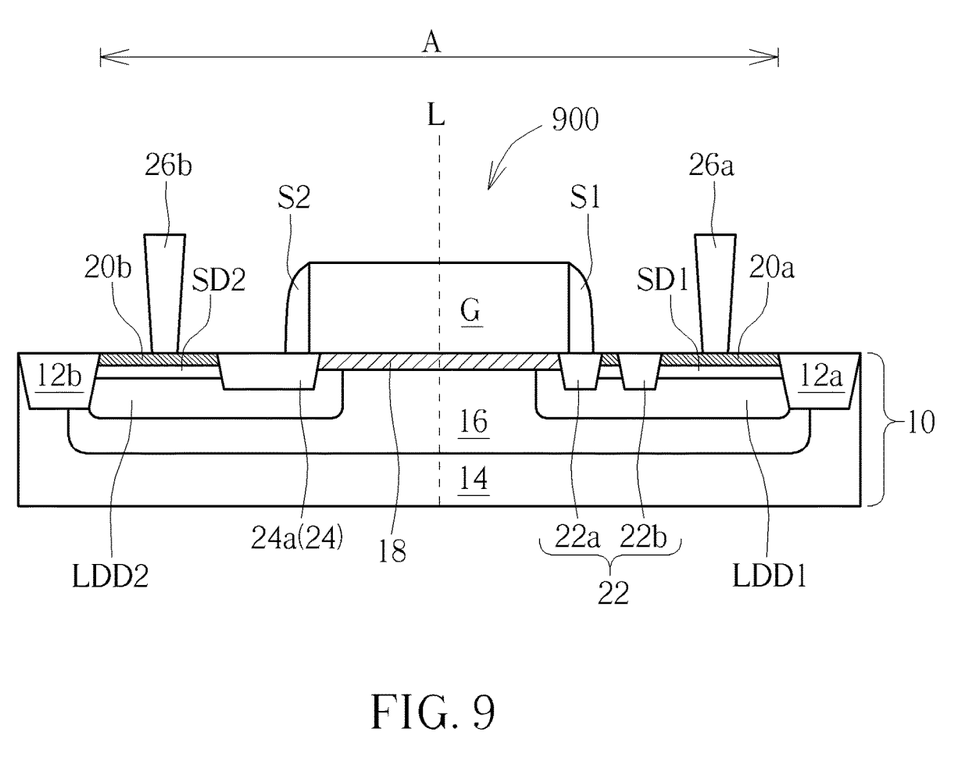
FIG. 9 depicts a transistor with an embedded insulating structure set according to a ninth preferred embodiment of the present invention.

FIG. 9 depicts a transistor with an embedded insulating structure set according to a ninth preferred embodiment of the present invention, wherein elements which are substantially the same as those in the first preferred embodiment are denoted by the same reference numerals; an accompanying explanation is therefore omitted.

As shown in FIG. 9, the transistor 900 with an embedded insulating structure set is an asymmetrical structure. The number of the insulating blocks in the first insulating structure set 22 is different from the number of the insulating blocks in the second insulating structure set 24. Moreover, the width of the insulating block 24a of the second insulating structure set 24 is greater than the widths of the insulating block 22a/22b. Because the shapes of the first insulating structure set 22 and the second insulating structure set 24 are different from each other, the range of the first source/drain doped region SD1 and the second source/drain doped region SD2 are also different from each other. Moreover, the relative position between the conductive plug 26a and the gate G, and the relative position between the conductive plug 26b and the gate G are also different because the shapes of the first insulating structure set 22 and the second insulating structure set 24 are different from each other.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transistor with an embedded insulating structure set, comprising:
    a substrate, wherein the substrate comprises an active region;
    a gate disposed within the active region;
    a gate dielectric layer disposed between the gate and the active region, wherein the gate dielectric layer is embedded within the substrate;
    a first lightly doped region disposed within the active region at one side of the gate;
    a second lightly doped region disposed within the active region at another side of the gate, wherein the first lightly doped region and the second lightly doped region have a same conductive type, and wherein by taking a symmetrical line of the gate as a given axis, the first lightly doped region is symmetrical to the second lightly doped region;
    a first source/drain doped region disposed within the first lightly doped region;
    a second source/drain doped region disposed within the second lightly doped region; and
    a first insulating structure set disposed within the first lightly doped region and the first source/drain doped region, wherein the first insulating structure set comprises a first insulating block embedded within the substrate and a sidewall of the first insulating block contacts the gate dielectric layer.

2. The transistor with an embedded insulating structure set of claim 1, further comprising two spacers respectively disposed at two sides of the gate, wherein part of the first insulating block overlaps the gate and another part of the first insulating block overlaps one of the two spacers.

3. The transistor with an embedded insulating structure set of claim 1, further comprising two spacers respectively disposed at two sides of the gate, wherein the first insulating block does not overlap the gate, and part of the first insulating block overlaps one of the two spacers.

4. The transistor with an embedded insulating structure set of claim 1, further comprising two shallow trench isolations embedded within the substrate, the two shallow trench isolations define the active region, wherein a depth of the first insulating block is smaller than a depth of each of the two shallow trench isolations.

5. The transistor with an embedded insulating structure set of claim 1, further comprising two shallow trench isolations embedded with the substrate, the two shallow trench isolations define the active region, wherein a depth of the first insulating block is the same as a depth of each of the two shallow trench isolations.

6. The transistor with an embedded insulating structure set of claim 1, wherein the sidewall of the first insulating block contacts an end of the gate dielectric layer.

7. The transistor with an embedded insulating structure set of claim 1, wherein part of the first insulating block overlaps the gate dielectric layer.

8. The transistor with an embedded insulating structure set of claim 1, wherein a depth of the first insulating block is larger than a depth of the first source/drain doped region, and the depth of the first insulating block is smaller than a depth of the first lightly doped region.

9. The transistor with an embedded insulating structure set of claim 1, wherein a depth of the first insulating block is smaller than a depth of the first source/drain doped region.

10. The transistor with an embedded insulating structure set of claim 1, wherein the first insulating structure set further comprises a second insulating block disposed within the first lightly doped region, and the second insulating block is farther from the gate than the first insulating block.

11. The transistor with an embedded insulating structure set of claim 10, wherein a width of the second insulating block is different from a width of the first insulating block.

12. The transistor with an embedded insulating structure set of claim 10, wherein a depth of the second insulating block is different from a depth of the first insulating block.

13. The transistor with an embedded insulating structure set of claim 10, wherein the first lightly doped region does not contact the second lightly doped region.

14. The transistor with an embedded insulating structure set of claim 1, further comprising a second insulating structure set disposed within the second lightly doped region and the second source/drain doped region.

15. The transistor with an embedded insulating structure set of claim 14, wherein by taking the symmetrical line of the gate as the given axis, the second insulating structure set is symmetrical to the first insulating structure set.

16. The transistor with an embedded insulating structure set of claim 14, wherein by taking the symmetrical line of the gate as the given axis, the first source/drain doped region is symmetrical to the second source/drain doped region.

17. The transistor with an embedded insulating structure set of claim 14, wherein by taking the symmetrical line of the gate as the given axis, the second insulating structure set is asymmetrical to the first insulating structure set.

18. The transistor with an embedded insulating structure set of claim 1, wherein there is no insulating structure set within the second lightly doped region.

19. The transistor with an embedded insulating structure set of claim 1, further comprising:
    a silicide layer contacting a top surface of the first source/drain doped region;
    a conductive plug contacting the silicide layer;
    a first shallow trench isolation and a second shallow trench isolation, wherein the first shallow trench isolation and the second shallow trench isolation are embedded within the substrate, the first shallow trench isolation and the second shallow trench define the active region, and the first shallow trench isolation contacts the first lightly doped region; wherein the conductive plug is disposed outside of the first insulating structure set and is disposed between the first insulating structure set and the first shallow trench isolation.

* * * * *